(12) United States Patent
Uno et al.

(10) Patent No.: US 11,038,460 B2
(45) Date of Patent: Jun. 15, 2021

(54) CIRCUIT APPARATUS, OSCILLATOR, ELECTRONIC INSTRUMENT, AND VEHICLE

(71) Applicant: Seiko Epson Corporation, Tokyo (JP)

(72) Inventors: Tomohiro Uno, Chino (JP); Katsuhito Nakajima, Minowa (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 17/023,543

(22) Filed: Sep. 17, 2020

(65) Prior Publication Data

US 2021/0083623 A1 Mar. 18, 2021

(30) Foreign Application Priority Data

Sep. 18, 2019 (JP) ................. 2019-168936

(51) Int. Cl.
*H03B 5/04* (2006.01)
*H03B 5/36* (2006.01)
*H03L 7/099* (2006.01)

(52) U.S. Cl.
CPC ............. *H03B 5/04* (2013.01); *H03B 5/36* (2013.01); *H03B 5/364* (2013.01); *H03L 7/099* (2013.01)

(58) Field of Classification Search
CPC .. H03B 5/04; H03B 5/36; H03B 5/364; H03L 7/099
USPC .................................................. 331/158, 176
See application file for complete search history.

(56) References Cited

U.S. PATENT DOCUMENTS

| 7,310,024 B2* | 12/2007 | Milliren .................. H03B 5/04 331/158 |
| 8,816,786 B2* | 8/2014 | Tham .................... H03B 5/364 331/109 |
| 2017/0194965 A1* | 7/2017 | Yonezawa ............... H03L 7/099 |

FOREIGN PATENT DOCUMENTS

| JP | 2010-062868 A | 3/2010 |
| JP | 2017-123552 A | 7/2017 |
| WO | 2012-157077 A1 | 11/2012 |

* cited by examiner

*Primary Examiner* — Arnold M Kinkead
(74) *Attorney, Agent, or Firm* — Harness, Dickey & Pierce, P.L.C.

(57) ABSTRACT

A circuit apparatus includes an oscillation circuit that causes a resonator to oscillate to produce an oscillation signal, an oven control circuit that controls a heater provided in correspondence with the resonator, a non-volatile memory that stores control data, a holding circuit that holds the control data transferred from the non-volatile memory, and a processing circuit that carries out a process based on the control data held in the holding circuit. After a power source voltage is supplied, the processing circuit carries out the process of transferring the control data from the non-volatile memory to the holding circuit, and after the transfer of the control data is completed, the processing circuit causes based on a data transfer end signal the oven control circuit to start operating.

12 Claims, 10 Drawing Sheets

FIG. 3

| REGISTER |
| --- |
| OSCILLATION ENABLE DATA |
| OVEN CONTROL ENABLE DATA |
| OUTPUT ENABLE DATA |
| FREQUENCY ADJUSTMENT DATA |
| ⋮ |
| RAM |
| TEMPERATURE COMPENSATION COEFFICIENT DATA |
| DIGITAL FILTER COEFFICIENT DATA |
| DATA FOR NEURAL NETWORKING |
| ⋮ |

CIRCUIT APPARATUS, OSCILLATOR, ELECTRONIC INSTRUMENT, AND VEHICLE

The present application is based on, and claims priority from JP Application Serial Number 2019-168936, filed Sep. 18, 2019, the disclosure of which is hereby incorporated by reference herein in its entirety.

BACKGROUND

1. Technical Field

The present disclosure relates to a circuit apparatus, an oscillator, an electronic instrument, a vehicle, and the like.

2. Related Art

There has been a known oscillator called an OCXO (oven controlled crystal oscillator). An OCXO is used as a reference signal source, for example, in a base station, a network router, and a measurement instrument. For example, JP-A-2017-123552 discloses an OCXO using a temperature sensor provided outside a circuit apparatus to improve the temperature resolution of temperature detection data.

Digital signal processing in an OCXO, such as temperature compensation, can be performed, for example, by using data transferred from a memory to a register at the time of activation of the OCXO. Immediately after the start of oven control in the OCXO, however, the current consumed by a heater abruptly increases in some cases depending on the temperature around the heater, and a voltage drop due to the abrupt increase in the consumed current temporarily unstabilizes the power source voltage. On the other hand, the amount of data transferred from the memory to the register at the time of the activation increase as the digital signal processing advances, and the increase in the amount of data undesirably prolongs the data transfer period. Therefore, when the abrupt increase in the current consumed by the heater unstabilizes the power source voltage in the long data transfer period, a data transfer error and other problems occur.

SUMMARY

An aspect of the present disclosure relates to a circuit apparatus including an oscillation circuit that causes a resonator to oscillate to produce an oscillation signal, an oven control circuit that controls a heater provided in correspondence with the resonator, a non-volatile memory that stores control data, a holding circuit that holds the control data transferred from the non-volatile memory, and a processing circuit that carries out a process based on the control data held in the holding circuit. After a power source voltage is supplied, the processing circuit carries out the process of transferring the control data from the non-volatile memory to the holding circuit, and after the transfer of the control data is completed, the processing circuit causes based on a data transfer end signal the oven control circuit to start operating.

BRIEF DESCRIPTION OF THE DRAWINGS

FIG. 3 shows an example of the contents stored in a register and a RAM.

DESCRIPTION OF EXEMPLARY EMBODIMENTS

An embodiment of the present disclosure will be described below. It is not intended that the present embodiment described below unduly limits the contents set forth in the appended claims. Further, all configurations described in the present embodiment are not necessarily essential configuration requirements.

1. Circuit Apparatus

Figure 1:
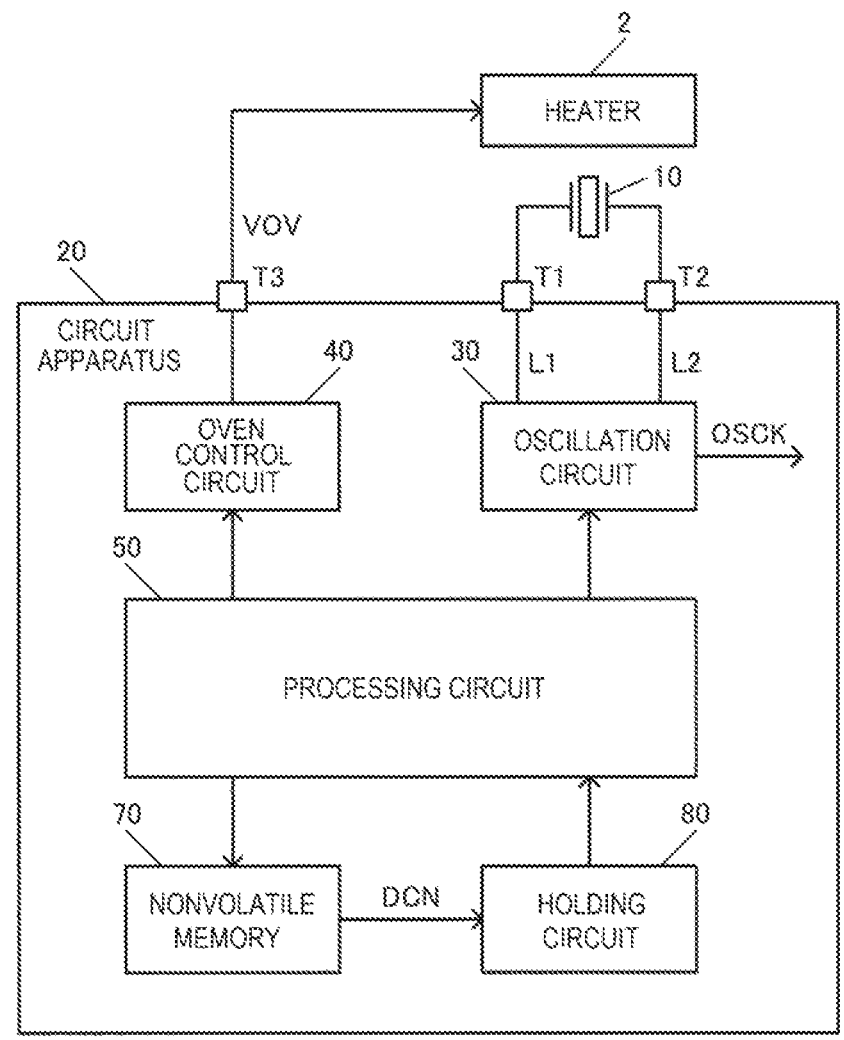
FIG. 1 shows an example of the configuration of a circuit apparatus according to an embodiment of the present disclosure.

FIG. 1 shows an example of the configuration of a circuit apparatus 20 according to the present embodiment. The circuit apparatus 20 includes an oscillation circuit 30, which causes a resonator 10 to oscillate, an oven control circuit 40, a processing circuit 50, a non-volatile memory 70, and a holding circuit 80. The circuit apparatus 20 is an integrated circuit (IC) manufactured, for example, in semiconductor processes and is, for example, a semiconductor chip in which circuit elements are formed on a semiconductor substrate. An oscillator 4 according to the present embodiment includes the resonator 10 and the circuit apparatus 20. The oscillator 4 further includes a heater 2. The resonator 10 is electrically coupled to the circuit apparatus 20. The resonator 10 is electrically coupled to the circuit apparatus 20, for example, by using internal wiring lines, bonding wires, or metal bumps in a package that accommodates the resonator 10 and the circuit apparatus 20.

The resonator 10 is a device that produces mechanical vibration in response to an electric signal. Specifically, the resonator 10 is a resonator built in an oven controlled crystal oscillator (OCXO) including a thermostatic chamber. The resonator 10 can be achieved, for example, by a resonator element, for example, a quartz crystal resonator element. For example, the resonator 10 can be achieved by a quartz crystal resonator that undergoes thickness slide resonance, such as a quartz crystal resonator cut at an AT cut angle or an SC cut angle. The resonator 10 in the present embodiment can be achieved by any of a variety of resonator elements, for example, a resonator element of type other than the thickness slide resonance type and a piezoelectric resonator element made of a material other than quartz crystal. For example, the resonator 10 may be a SAW (surface acoustic wave) resonator or a MEMS (micro electro mechanical systems) resonator in the form of a silicon resonator formed by using a silicon substrate.

The oscillation circuit 30 causes the resonator 10 to oscillate to produce an oscillation signal OSCK. For example, the oscillation circuit 30 is electrically coupled to the resonator 10 via resonator coupling pads T1 and T2 of the circuit apparatus 20 and produces the oscillation signal OSCK by causing the resonator 10 to oscillate. For example, the oscillation circuit 30 drives the resonator 10 via signal lines L1 and L2 coupled to the pads T1 and T2 to cause the resonator 10 to oscillate. The oscillation circuit 30 includes a drive circuit and other components for oscillation that are provided between the pads T1 and T2. For example, the oscillation circuit 30 can be achieved by a transistor, such as a bipolar transistor that achieves the drive circuit, and passive elements, such as a capacitor and a resistor. The drive circuit is a core circuit of the oscillation circuit 30, and the drive circuit drives the resonator 10 based on current or voltage to cause the resonator 10 to oscillate. The oscillation circuit 30 can be any of a variety of types of oscillation circuit, for example, a pierce-type oscillation circuit, a Colpitts-type oscillation circuit, an inverter-type oscillation circuit, or a Hartley-type oscillation circuit. The oscillation circuit 30 may be provided with a variable capacity circuit, and the oscillation frequency of the oscillation circuit 30 may be adjustable by adjustment of the capacity of the variable capacity circuit. The variable capacity circuit can be achieved by a variable capacity device, such as a varactor. It is noted that the coupling in the present embodiment is electrical coupling. The electrical coupling refers to coupling that allows transmission of an electric signal and hence transmission of information carried by the electric signal. The electrical coupling may be coupling via an active element or any other component.

The oven control circuit 40 controls the heater 2 provided in correspondence with the resonator 10. For example, the oven control circuit 40 performs oven control on the resonator 10, which is an oven-type resonator including a thermostatic chamber. That is, the oven control circuit 40 controls the heater 2 to control the temperature of the thermostatic chamber that is an oven in which the resonator 10 is provided. The thermostatic chamber may be of single oven type or double oven type. Specifically, the oven control circuit 40 controls heat generation performed by the heater 2 based on the result of temperature detection performed by an oven-control temperature sensor provided in correspondence with the resonator 10. The temperature sensor is provided, for example, outside the circuit apparatus 20. A temperature sensor provided in the circuit apparatus 20 may instead be used. For example, the oven control circuit 40 outputs an oven control signal VOV, which is a voltage signal for oven control, to the heater 2 to control the temperature of the heat generated by the heater 2. The oven control signal VOV, which is a heater control signal, is outputted via a pad T3 to the heater 2, which is provided outside the circuit apparatus 20. The oven control circuit 40 then performs temperature adjustment in such a way that an oven temperature that is the temperature of the thermostatic chamber is equal to a set temperature. The heater 2 is, for example, a heat generator for adjusting the oven temperature. The heater 2 is provided in correspondence with the resonator 10 and is provided at a location corresponding to the resonator 10. Specifically, the heater 2 is disposed along with the resonator 10 in the thermostatic chamber. For example, the heater 2 is disposed in the vicinity of the resonator 10.

Figure 2:
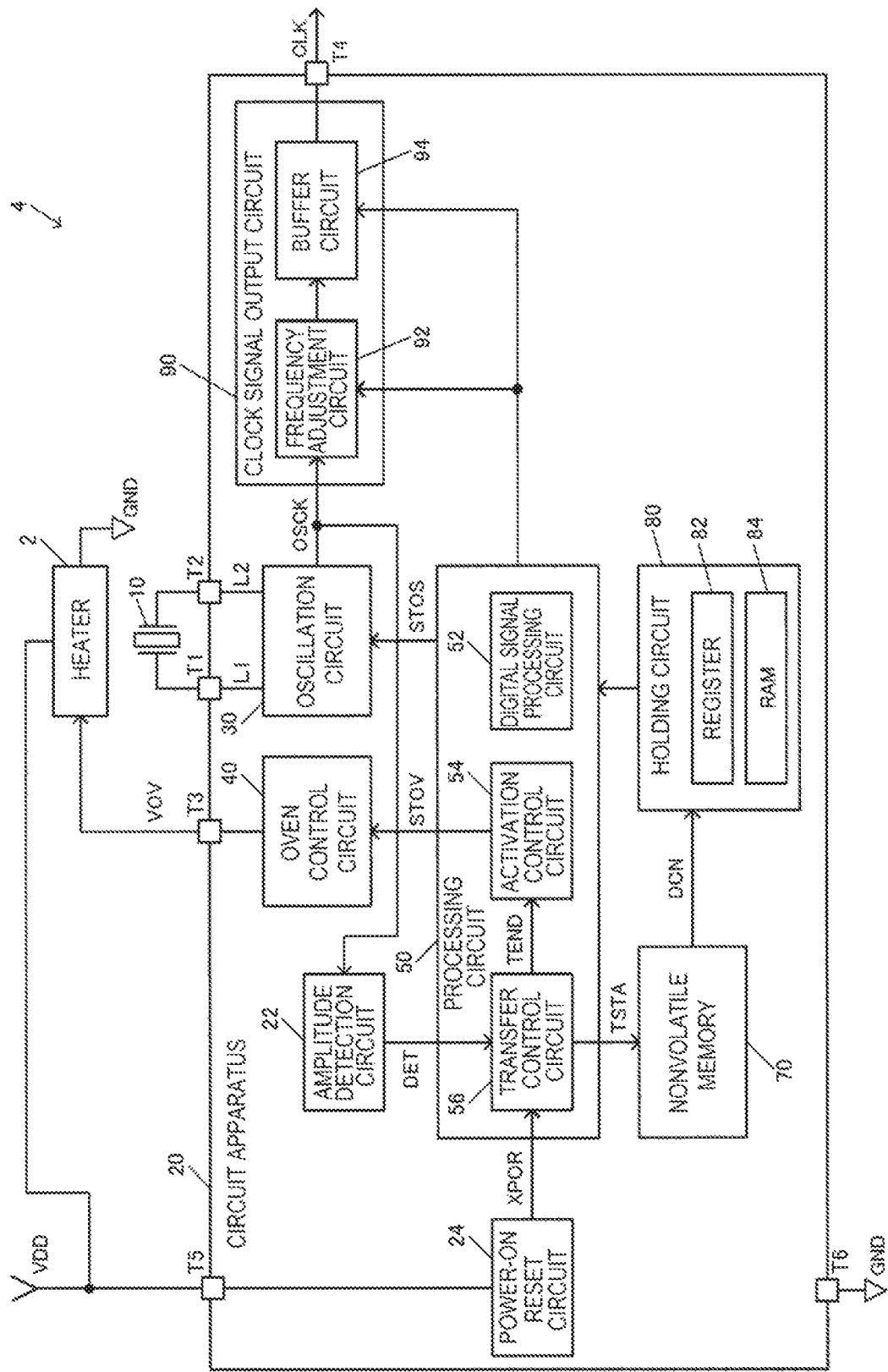
FIG. 2 shows an example of the detailed configuration of the circuit apparatus according to the present embodiment.

The non-volatile memory 70 is a nonvolatile-type memory that stores a variety of types of information. Specifically, the non-volatile memory 70 stores control data DCN. The control data DCN is data for controlling the circuit apparatus 20 and is also data for a variety of settings for control and action of the circuit apparatus 20. The holding circuit 80 is a circuit that temporarily stores a variety of types of information. Specifically, the holding circuit 80 holds the control data DCN transferred from the non-volatile memory 70. That is, the holding circuit 80 temporarily stores the control data DCN. The non-volatile memory 70 can, for example, be an EEPROM (Electrically Erasable Programmable Read-Only Memory), which can electrically delete data, or an OTP (One Time Programmable) memory, for example, using an FAMOS (Floating gate Avalanche injection MOS). The non-volatile memory 70 may instead be a memory using a fuse cell. The holding circuit 80 can be achieved by a register 82 and a RAM 84 as shown in FIG. 2, which will be described later.

The processing circuit 50 performs a variety of types of processing. Specifically, the processing circuit 50 performs processing based on the control data DCN held by the holding circuit 80. For example, the processing circuit 50 performs processing for controlling each of the circuits of the circuit apparatus 20 and digital signal processing, such as temperature compensation and digital filtering. The processing circuit 50 can be achieved, for example, by an ASIC (Application Specific Integrated Circuit) achieved by automatically routed wiring, such as a gate array. The processing circuit 50 may instead be achieved by a CPU, a DSP, or any other processor.

In the present embodiment, the processing circuit 50 carries out the process of transferring the control data DCN from the non-volatile memory 70 to the holding circuit after the power source voltage is supplied to the processing circuit 50, and when the transfer of the control data DCN is completed, the processing circuit 50 causes the oven control circuit 40 to start operating. Specifically, the processing circuit 50 causes the oven control circuit 40 to start operating based on a data transfer end signal TEND in FIG. 2, which will be described later. That is, when the data transfer end signal TEND becomes active, the processing circuit 50 causes the oven control circuit 40 to start operating. For example, when the power source voltage is supplied to the circuit apparatus 20, the processing circuit 50 instructs transfer of the control data DCN from the non-volatile memory 70 to the holding circuit 80. For example, when the circuit apparatus 20 is powered on so that power-on reset state is canceled, the processing circuit 50 instructs the transfer of the control data DCN. The control data DCN stored in the non-volatile memory 70 is thus read and transferred to the holding circuit 80. After the control data DCN is transferred to and held in the holding circuit 80, the processing circuit 50 instructs the oven control circuit 40 to start operating. The oven control circuit 40 is thus activated and controls the heater 2. That is, the oven control circuit 40 outputs the oven control signal VOV according to the result of the temperature detection performed by the temperature sensor to control the temperature of the thermostatic chamber in which the resonator 10 is provided. For example, the temperature control is so performed that the temperature of the thermostatic chamber falls within a fixed range.

For example, at the time of activation of the oven control, the current to be consumed by the heater 2 abruptly flows to the heater 2, resulting in variation in power source voltage VDD supplied to the circuit apparatus 20 and variation in power source voltage GND, that is, resulting in unstable power source voltages. When the control data DCN is transferred from the non-volatile memory 70 to the holding circuit 80 in such an unstable power source voltage state, a data transfer error and other problems could occur. For example, when the processing circuit 50 performs the digital signal processing, such as the temperature compensation in the OCXO, the amount of control data DCN transferred from the non-volatile memory 70 to the holding circuit 80 increases, and the data transfer period lengthens accordingly. For example, when the amount of control data DCN is several hundreds of bits, the length of the data transfer period is about several microseconds, whereas when high-precision data signal processing is performed, the length of the data transfer period becomes several milliseconds or longer. Therefore, when the power source voltage becomes unstable in such a long data transfer period, a data transfer error occurs, undesirably resulting in a situation in which incorrect control data DCN is transferred. When the circuit apparatus 20 is controlled or digital signal processing is performed based on such incorrect control data DCN, the circuit apparatus 20 malfunctions, the digital signal processing, such as the temperature compensation, is performed incorrectly, or other problems occur.

In this regard, in the present embodiment, the oven control circuit 40 does not start operating immediately after the power source voltage is supplied, but the control data DCN is transferred from the non-volatile memory 70 to the holding circuit 80 before the oven control circuit 40 starts operating. After the transfer of the control data DCN to the holding circuit 80 is completed, the processing circuit 50 instructs the oven control circuit 40 to start operating, and the oven control circuit 40 starts controlling the heater 2. In this way, the oven control circuit 40 does not start operating in the data transfer period in which the control data DCN is transferred from the non-volatile memory 70 to the holding circuit 80, so that no oven control in which the heater 2 is controlled is performed, preventing the unstable power source voltage due to an abrupt increase in the current consumed by the heater 2. The situation in which an unstable power source voltage in the data transfer period causes incorrect control data DCN to be transferred to the holding circuit 80 can therefore be suppressed. That is, the transfer of the control data DCN can be completed before the power source voltage becomes unstable due to abrupt current consumption in the heater 2, whereby a risk of incorrect data transfer can be reduced. For example, since several seconds are necessary before proper oven feedback control is performed, waiting for the end of the data transfer period of about several milliseconds results only in very small adverse effects.

FIG. 2 shows an example of the detailed configuration of the circuit apparatus 20. The circuit apparatus 20 according to the present embodiment does not necessarily have the configuration shown in FIG. 2, and a variety of variations are conceivable, that is, part of the components in the configuration can be omitted, or another component can be added to the configuration. The circuit apparatus 20 may be provided, for example, with a temperature sensor and an A/D conversion circuit that converts a temperature detection voltage from the temperature sensor from an analog form into a digital form.

The circuit apparatus 20 includes a power-on reset circuit 24. The power-on reset circuit 24, to which the power source voltage VDD is externally supplied via a pad T5, which is a power source terminal, outputs a power-on reset signal XPOR. The power source voltage VDD is also supplied to the heater 2. The power source voltage GND is inputted to the circuit apparatus 20 via a pad T6, which is a GND terminal, and supplied to each of the circuits provided in the circuit apparatus 20. For example, the power source voltage VDD is inputted via an external connection terminal of the oscillator 4 and supplied to the circuit apparatus 20 and the heater 2. The power source voltage GND is also supplied to the heater 2. The power-on reset circuit 24, to which the power source voltage VDD is supplied, then changes the level of the power-on reset signal XPOR from a level L to a level H when the power source voltage VDD becomes greater than or equal to a given voltage to, for example, cancel the reset state of the processing circuit 50. The letter "X" of the power-on reset signal XPOR means the negative logic, and when the power-on reset signal XPOR has the level L, the processing circuit 50 operates in the reset state, and when the level of the power-on reset signal XPOR changes to the level H, the reset state is canceled. The processing circuit 50 thus starts operating and instructs, for example, the transfer of the control data DCN from the non-volatile memory 70 to the holding circuit 80. Specifically, the processing circuit 50 outputs a transfer start signal TSTA to the non-volatile memory 70 to instruct the non-volatile memory 70 to start transferring the control data DCN.

The circuit apparatus 20 further includes an amplitude detection circuit 22. The amplitude detection circuit 22 detects the amplitude of the oscillation signal OSCK from the oscillation circuit 30. The amplitude detection circuit 22 can be achieved, for example, by a peak detection circuit that detects and holds a peak of the oscillation signal OSCK. After the action of the oscillation circuit 30 is enabled, and when the amplitude detection circuit 22 detects that the amplitude of the oscillation signal OSCK exceeds a predetermined value, the amplitude detection circuit 22 makes a detection signal DET active. For example, the amplitude detection circuit 22 changes the level of the detection signal DET from the level L to the level H. When the amplitude detection circuit 22 detects that the amplitude of the oscillation signal OSCK exceeds the predetermined value, the processing circuit 50 carries out the process of starting transfer of the control data DCN from the non-volatile memory 70 to the holding circuit 80. For example, after the power-on reset signal XPOR cancels the reset state, and when the amplitude of the oscillation signal OSCK exceeds the predetermined value so that the detection signal DET from the amplitude detection circuit 22 is made active, the processing circuit 50 makes the transfer start signal TSTA active to instruct transfer of the control data DCN from the non-volatile memory 70 to the holding circuit 80.

The circuit apparatus 20 further includes a clock signal output circuit 90. The clock signal output circuit 90, to which the oscillation signal OSCK is inputted from the oscillation circuit 30, outputs a clock signal CLK based on the oscillation signal OSCK to an external component via a pad T4, which is a clock output terminal. The clock signal CLK is outputted to a component external to the oscillator 4, for example, via the external connection terminal of the oscillator 4. The clock signal output circuit 90 includes a frequency adjustment circuit 92 and a buffer circuit 94. The frequency adjustment circuit 92 adjusts the frequency of the oscillation signal OSCK and produces the clock signal CLK having a desired frequency. The buffer circuit 94 buffers the produced clock signal CLK and outputs the clock signal CLK to the external component via the pad T4.

The frequency adjustment circuit 92 can be achieved, for example, by a fractional-N-type PLL circuit. The fractional-N-type PLL circuit compares in terms of phase a reference clock signal that is the oscillation signal OSCK with a feedback clock signal that is a clock signal outputted from the fractional-N-type PLL circuit and divided by a divider circuit. A delta-sigma modulation circuit is then used to set a decimal division ratio. The fractional-N-type PLL circuit is thus achieved. Thereafter, for example, the processing circuit 50 carries out the process of setting division ratio data set in the fractional-N-type PLL circuit, which is the frequency adjustment circuit 92, based on the temperature compensation data to achieve the temperature compensation. Setting the division ratio data further allows the frequency of the clock signal CLK to be set at a desired frequency required by an application. The buffer circuit 94 is a circuit that buffers the clock signal CLK and outputs the buffered clock signal CLK to the external component. The signal format of the outputted clock signal CLK may be the single-ended CMOS signal format. The signal format may instead be any other signal format, such as LVDS (Low Voltage Differential Signaling), PECL (Positive Emitter Coupled Logic), HCSL (High Speed Current Steering Logic), and differential CMOS (Complementary MOS). Still instead, a desired signal format may be selected from the signal formats described above.

The processing circuit 50 includes a digital signal processing circuit 52, which performs digital signal processing. The digital signal processing circuit 52 operates as a DSP (Digital Signal Processor) and performs the digital signal processing including, for example, the temperature compensation performed on the oscillation frequency of the resonator 10. The digital signal processing circuit 52 further performs digital filtering as the digital signal processing. The digital signal processing circuit 52 performs, for example, FIR (Finite Impulse Response), IIR (Infinite Impulse Response), and other types of digital filtering. The digital signal processing circuit 52 may further perform digital signal processing for aging correction. For example, the digital signal processing circuit 52 performs Kalman filtering as the digital signal processing for aging correction. The digital signal processing circuit 52 may perform neural networking as the digital signal processing. For example, the digital signal processing circuit 52 performs AI-based (Artificial-Intelligence-based) neural networking that estimates the temperature of the resonator 10 based on the result of the temperature detection performed by the temperature sensor provided outside the circuit apparatus 20 or the temperature sensor provided inside the circuit apparatus 20.

The processing circuit 50 further includes an activation control circuit 54 and a transfer control circuit 56. The activation control circuit 54 controls activation of the oven control circuit 40. That is, the activation control circuit 54 controls a sequence in accordance with which the oven control circuit 40 is activated. For example, the activation control circuit 54 outputs an oven control start signal STOV to the oven control circuit 40 to control the activation of the oven control circuit 40. The transfer control circuit 56 controls transfer associated with the non-volatile memory 70. That is, the transfer control circuit 56 controls the transfer of the control data DCN from the non-volatile memory 70 to the holding circuit 80. For example, the activation control circuit 54 outputs the transfer start signal TSTA to the non-volatile memory 70 to control the transfer of the control data DCN. The activation control circuit 54 and the transfer control circuit 56 will be described later in detail.

The holding circuit 80 includes a register 82 and a RAM 84. The register 82 holds a variety of data for setting the action of the circuit apparatus 20 as the control data DCN. For example, the control data contains action control data for controlling the action of the oscillation circuit 30 and digital signal processing data used in the digital signal processing. The register 82 holds the action control data. The register 82 can be achieved, for example, by flipflop circuits. The RAM 84 is a memory that stores the variety of data as the control data DCN and can be achieved, for example, by an SRAM. For example, the RAM 84 holds the digital signal processing data. That is, the RAM 84 holds as the control data DCN the digital signal processing data used in the digital signal processing performed by the digital signal processing circuit 52. The oscillation circuit 30 can thus be so controlled as to start the oscillation action by using the action control data, which is control data on the action of the oscillation circuit 30 and which is transferred from the non-volatile memory 70 to the register 82. Specifically, the processing circuit 50 makes an oscillation start signal STOS to be outputted to the oscillation circuit 30 active to cause the oscillation circuit 30 to start the oscillation action. After the oscillation circuit 30 thus starts the oscillation action using the resonator 10 and produces the oscillation signal OSCK, the digital signal processing data transferred from the non-volatile memory 70 to the RAM 84 can be used to allow the digital signal processing circuit 52 to perform the digital signal processing, such as the temperature compensation.

FIG. 3 shows an example of the contents stored in the register 82 and the RAM 84. The register 82 stores, for example, the action control data, such as oscillation enable data, oven control enable data, and output enable data, as the control data DCN, as shown in FIG. 3. The register 82 further stores frequency adjustment data as the control data DCN. The oscillation enable data is bit data that enables and disables the oscillation circuit 30 to operate and is also the action control data on the action of the oscillation circuit 30. The oven control enable data is bit data that enables and disables the oven control circuit 40 to operate and is also the action control data on the action of the oven control circuit 40. The output enable data is bit data that enables and disables the clock signal output circuit 90 to output the clock signal CLK. The register 82 further stores the frequency adjustment data for adjustment of the frequency of the clock signal CLK as the control data DCN. The frequency of the clock signal CLK can be set based on the frequency adjustment data at a desired frequency required by an application. For example, when the frequency adjustment circuit 92 is formed of a fractional-N-type PLL circuit, the division ratio data for setting the division ratio that serves as the reference of the PLL circuit is stored as the frequency adjustment data in the register 82.

The RAM 84 stores temperature compensation coefficient data used to perform the temperature compensation and digital filter coefficient data used to perform the digital filtering as the digital signal processing data. The digital signal processing data may contain at least one of the temperature compensation coefficient data and the digital filter coefficient data. The temperature compensation coefficient data is coefficient data for the temperature compensation performed by the digital signal processing circuit 52 and is also polynomial coefficient data used when a temperature compensation voltage that compensates the frequency-temperature characteristics of the resonator 10 is approximately expressed by a polynomial. For example, when the temperature compensation voltage is approximately expressed by a polynomial of the fifth degree, data for setting the zeroth-degree coefficient, the first-degree coefficient, the second-degree coefficient, the third-degree coefficient, the fourth-degree coefficient, and the fifth-degree coefficient of the polynomial are stored as the temperature compensation coefficient data in the RAM 84. The degree of the polynomial is not limited to five and may instead be four or smaller or six or greater. The digital filter coefficient data is coefficient data for the digital filtering performed by the digital signal processing circuit 52. The digital filter coefficient data may be coefficient data for FIR lowpass filtering or a coefficient data for Kalman filtering. The RAM 84 further stores data for neural networking. For example, when the digital signal processing circuit 52 estimates the temperature of the resonator 10 by using neural networking based on the result of the temperature detection performed by the temperature sensor provided outside or inside the circuit apparatus 20, data necessary for the neural networking is stored in the RAM 84. For example, coefficients for the neural networking or data for setting the gain or the offset of the neural networking are stored.

As described above, in the present embodiment, the digital signal processing data stored in the RAM 84 contains at least one of the temperature compensation coefficient data and the digital filter coefficient data. For example, the temperature compensation coefficient data and the digital filter coefficient data are each a large amount of data. The RAM 84 has a smaller circuit area than that of the register 82 but can store a larger amount of data than the register 82. Therefore, storing the temperature compensation coefficient data and the digital filter coefficient data in the RAM 84 as the control data DCN transferred from the non-volatile memory 70 allows data storage using a smaller circuit area than data storage in the register 82, whereby the scale of the circuit apparatus 20 can be reduced.

Figure 4:
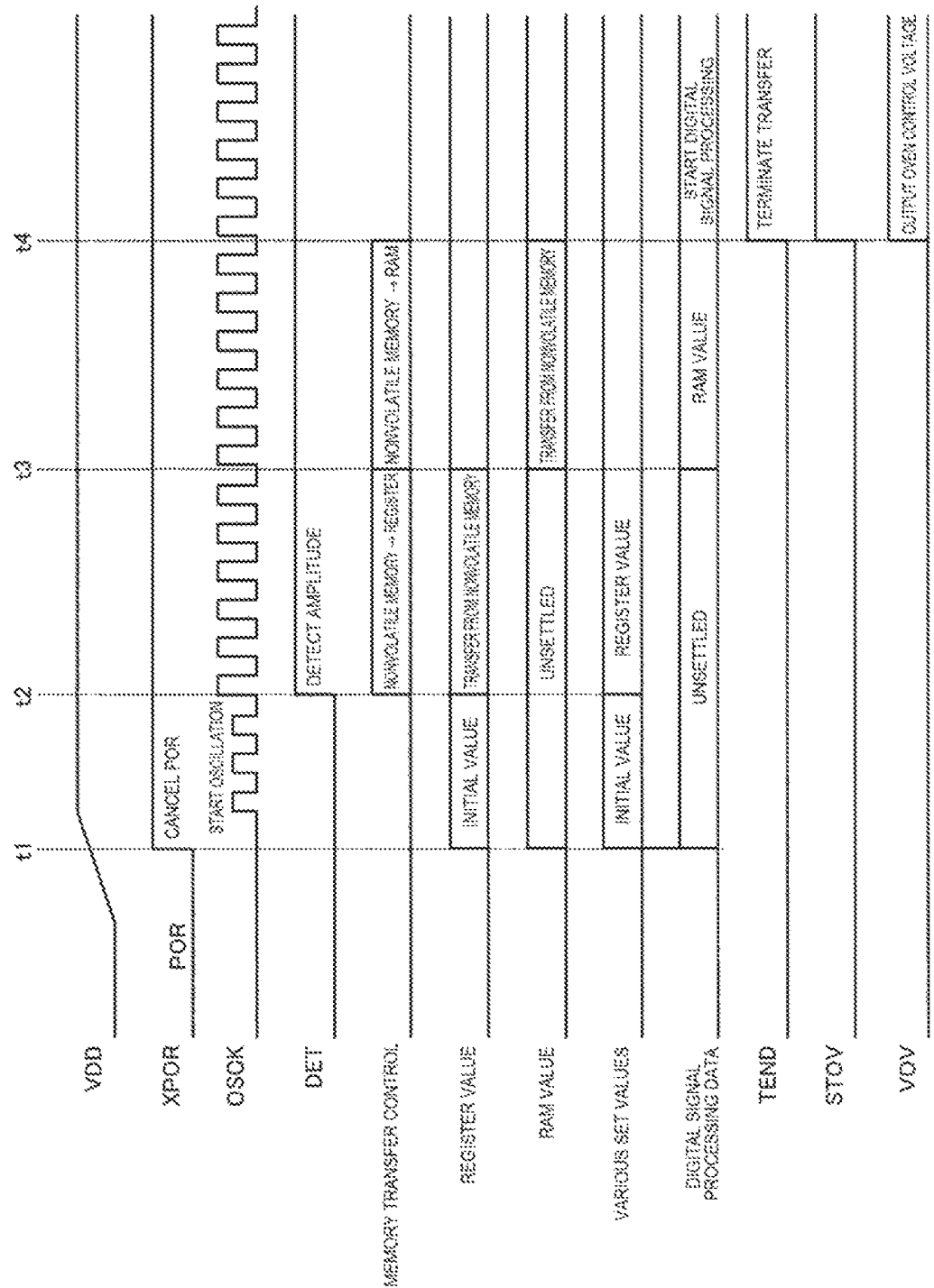
FIG. 4 shows an example of signal waveforms that describe the action of the circuit apparatus according to the present embodiment.

FIG. 4 shows an example of the signal waveform that describes the action of the circuit apparatus 20 according to the present embodiment. After the power source voltage VDD is supplied, and when the power source voltage VDD exceeds power-on reset cancellation threshold voltage at a timing t1, the power-on reset circuit 24 changes the level of the power-on reset signal XPOR from the level L to the level H. The reset state of the processing circuit 50 is thus canceled, and the processing circuit 50 starts operating. When the processing circuit 50 makes the oscillation start signal STOS active, the oscillation circuit 30 starts the oscillation action.

An initial register value has been set in the register 82 at the timing t1, when the reset state is canceled. For example, after the power source voltage VDD is supplied, the register value held in the register 82 is set at the initial value. Specifically, out of the plurality of flipflop circuits that form the register 82, the reset terminal of a flipflop circuit that stores "0" as the initial value is set to be active, and the set terminal of a flipflop circuit that stores "1" as the initial value is set to be active. The register value held by the plurality of flipflop circuits is thus set at the initial value. When the register value of the register 82 is set at the initial value, a variety of set values in the circuit apparatus 20 that are set by the register value are also set at initial values. That is, the voltage levels of a variety of setting signals set by the register value of the register 82 are set at voltage levels corresponding to the initial register value. Each of the circuits of the circuit apparatus 20 thus operate in accordance with the initial register value. For example, the oscillation action start signal STOS shown in FIG. 2 has an active voltage level based on the initial register value, and the oscillation action of the oscillation circuit 30 is enabled. The oscillation circuit 30 thus starts the oscillation action after the power source voltage VDD is supplied. On the other hand, the output of the clock signal CLK from the clock signal output circuit 90 is disabled based on the initial register value, and the clock signal CLK is not outputted immediately after the power source voltage VDD is supplied.

As described above, in the present embodiment, an initial value is set in the register 82 after the power source voltage VDD is supplied. In the period after the power source voltage VDD is supplied but before the control data DCN is transferred from the non-volatile memory 70 to the holding circuit 80, the oscillation action of the oscillation circuit 30 is enabled based on the action control data set as the initial value in the register 82. In this way, after the power source voltage VDD is supplied, the oscillation action of the oscillation circuit 30 is enabled based on the action control data set as the initial value in the register 82, and the oscillation action is allowed to start. Thereafter, for example, an action clock signal based on the oscillation signal OSCK from the oscillation circuit 30 is used to allow each of the circuits of the circuit apparatus 20 to operate. For example, the action clock signal based on the oscillation signal OSCK allows the processing circuit 50 to operate to achieve the transfer of the control data DCN from the non-volatile memory 70 to the holding circuit 80.

When the oscillation circuit 30 starts the oscillation action, the amplitude detection circuit 22 detects the amplitude of the oscillation signal OSCK. Thereafter, when the amplitude detection circuit 22 detects that the amplitude of the oscillation signal OSCK exceeds the predetermined value, which is a predetermined voltage, at a timing t2, the level of the detection signal DET changes from the level L to the level H. That is, the level of the detection signal DET becomes the active voltage level. When the detection signal DET becomes active, the processing circuit 50 having received the detection signal DET makes the transfer start signal TSTA active and starts the transfer of the control data DCN from the non-volatile memory 70 to the holding circuit 80. Specifically, the transfer of the control data DCN from the non-volatile memory 70 to the holding circuit 80 first starts, and the register 82 then holds a register value corresponding to the control data DCN. Thereafter, when the transfer to the register 82 is completed, as shown at a timing t3, the transfer of the control data DCN from the non-volatile memory 70 to the RAM 84 of the holding circuit 80 starts, and the RAM 84 thus holds a RAM value corresponding to the control data DCN.

As described above, in the present embodiment, the circuit apparatus 20 includes the amplitude detection circuit 22, which detects the amplitude of the oscillation signal OSCK from the oscillation circuit 30. After the action of the oscillation circuit 30 is enabled, the amplitude detection circuit 22 detects whether or not the amplitude of the oscillation signal OSCK has exceeded the predetermined value. For example, after the power source voltage VDD is supplied, the oscillation circuit 30 starts the oscillation action, and the amplitude detection circuit 22 detects whether or not the amplitude of the oscillation signal OSCK has exceeded the predetermined value. When the amplitude detection circuit 22 detects that the amplitude of the oscillation signal OSCK has exceeded the predetermined value, as shown at the timing t2 in FIG. 4, the processing circuit 50 starts transferring the control data DCN from the non-volatile memory 70 to the holding circuit 80. For example, in FIG. 4, the transfer of the control data DCN from the non-volatile memory 70 to the register 82 first starts, and when the transfer is completed, the transfer of the control data DCN from the non-volatile memory 70 to the RAM 84 starts. In this way, the transfer of the control data DCN is allowed to start after the amplitude of the oscillation signal OSCK becomes a proper level.

For example, when the oscillation signal OSCK does not reach a sufficiently high amplitude level, the action clock signal based on the oscillation signal OSCK undesirably has narrow pulses, which could cause malfunction of the processing circuit 50 and other circuits. For example, an error of transfer of the control data DCN and other problems undesirably occur. In this regard, in the present embodiment, the transfer of the control data DCN starts after the amplitude of the oscillation signal OSCK exceeds the predetermined value, as shown at the timing t2 in FIG. 4. Occurrence of the error of transfer of the control data DCN due to the narrow pulses resulting from an insufficient amplitude level of the oscillation signal OSCK can therefore be avoided.

When the transfer of the control data DCN from the non-volatile memory 70 to the holding circuit 80 is completed, the processing circuit 50 changes the level of the data transfer end signal TEND from the level L to the level H to achieve an active voltage level, as shown at a timing t4. The processing circuit 50 then changes the level of the oven control start signal STOV from the level L to the level H, which is the active voltage level. The oven control circuit 40 thus starts the oven control and outputs the oven control signal VOV, which is an oven control voltage output signal, to the heater 2. The oven control circuit 40 thus starts controlling the heater 2. Further, the digital signal processing circuit 52 of the processing circuit 50 starts the digital signal processing, such as the temperature compensation, based on the digital signal processing data set by the RAM value of the RAM 84. A temperature-compensated clock signal CLK is thus outputted from the circuit apparatus 20.

Figure 5:
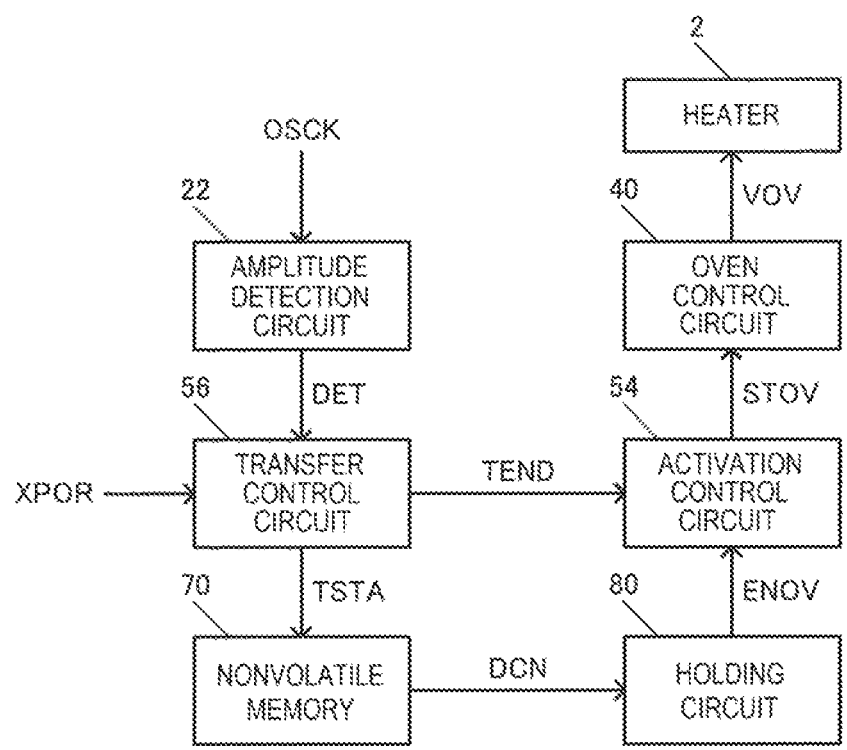
FIG. 5 describes the action of the circuit apparatus according to the present embodiment.

FIG. 5 describes detailed actions in the present embodiment. In the present embodiment, the processing circuit 50 includes the transfer control circuit 56, which controls the transfer from the non-volatile memory 70, and the activation control circuit 54, which controls the activation of the oven control circuit 40, as shown in FIGS. 2 and 5. After the power source voltage VDD is supplied, the transfer control circuit 56 instructs the transfer of the control data DCN from the non-volatile memory 70 to the holding circuit 80. For example, the transfer control circuit 56 makes the transfer start signal TSTA active to instruct the non-volatile memory 70 to transfer the control data DCN. Specifically, the transfer control circuit 56, to which the detection signal DET has been inputted from the amplitude detection circuit 22, makes the transfer start signal TSTA active when the detection signal DET becomes active to instruct start of the transfer of the control data DCN. More specifically, the power-on reset signal XPOR has been inputted from the power-on reset circuit 24 to the transfer control circuit 56. After the level of the power-on reset signal XPOR changes to the level H so that the reset state of the processing circuit 50 is canceled, when the detection signal DET becomes active, the transfer control circuit 56 makes the transfer start signal TSTA active to instruct start of the transfer of the control data DCN. In this way, after the oscillation circuit 30 starts the oscillation action, and when the amplitude detection circuit 22 detects that the amplitude of the oscillation signal OSCK has exceeded the predetermined value, the transfer control circuit 56 can start transferring the control data DCN from the non-volatile memory 70 to the holding circuit 80, as shown at the timing t2 in FIG. 4. After the transfer of the control data DCN is completed, the transfer control circuit 56 outputs the data transfer end signal TEND to the activation control circuit 54 to start the action of the oven control circuit 40. That is, when the data transfer end signal TEND is made active, the activation control circuit 54 makes the oven control start signal STOV active, and the oven control circuit 40 having received the start signal STOV starts the oven control performed on the heater 2.

In this way, after the power source voltage VDD is supplied, the transfer control circuit 56 is used to instruct the transfer of the control data DCN, and when the transfer is completed, the transfer control circuit 56 outputs the data transfer end signal TEND to the activation control circuit 54, whereby the activation control circuit 54 can be used to cause the oven control circuit 40 to start operating. Therefore, after the power source voltage VDD is supplied, the transfer of the control data DCN from the non-volatile memory 70 to the holding circuit 80 starts, and after the transfer is completed, the oven control circuit 40 can start the oven control. The situation in which the power source voltage VDD is unstable due to an abrupt increase in the current consumed by the heater 2 to cause a data transfer error and other problems can therefore be effectively avoided.

Further, the activation control circuit 54 performs the activation control that causes the oven control circuit 40 to start operating when an oven control enable signal ENOV set by the control data in the holding circuit 80 is active and the data transfer end signal TEND is active. For example, the oven control enable signal ENOV is set by the register value of the register 82, as shown in FIG. 3. The register initial value is so set that an oven control enable bit is active, so that the oven control starts after the power source voltage VDD is supplied. Therefore, after the power source voltage VDD is supplied, the oven control enable signal ENOV set by the register value of the register 82 of the holding circuit 80 becomes active. However, the activation control circuit 54 does not make the oven control start signal STOV active even when the oven control enable signal ENOV is active but unless the data transfer end signal TEND becomes active. When the oven control enable signal ENOV is active, and when the data transfer end signal TEND becomes active, the activation control circuit 54 makes the oven control start signal STOV active to cause the oven control circuit 40 to start operating, as shown at the timing t4 in FIG. 4. In this way, after the power source voltage VDD is supplied, the oven control circuit 40 waits for the completion of the transfer of the control data DCN from the non-volatile memory 70 to the holding circuit 80 and is then allowed to start operating. The situation in which the power source voltage VDD is unstable due to an abrupt increase in the current consumed by the heater 2 to cause a data transfer error and other problems can therefore be effectively avoided.

2. Oven Control Circuit, Heater 2

Figure 6:
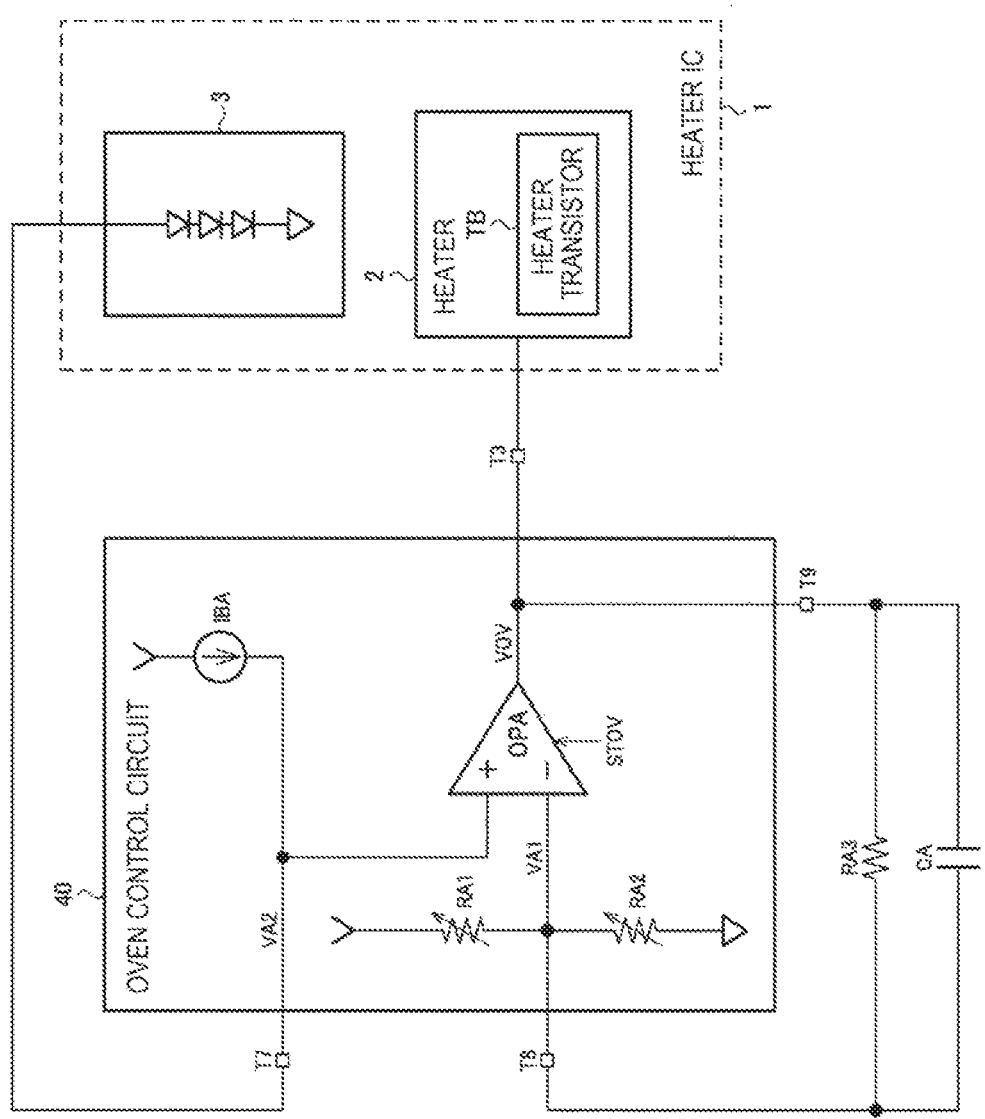
FIG. 6 shows an example of the configuration of an oven control circuit.

FIG. 6 shows an example of the configuration of the oven control circuit 40. The oven control circuit 40 includes an operational amplifier OPA, a current source IBA, and resistors RA1 and RA2. A temperature sensor 3 is a temperature detection device for oven control and is provided in the oscillator 4. Specifically, the temperature sensor 3 is provided along with the resonator 10 in the thermostatic chamber. In FIG. 6, the temperature sensor 3 is achieved by diodes. That is, the temperature sensor 3 is achieved by PN junctions. The temperature sensor 3 is coupled to the oven control circuit 40 via a pad T7, which is a connection terminal. The current source IBA supplies the temperature sensor 3 with a bias current via the pad T7, and a voltage VA2 in the forward direction of the diodes is inputted to the oven control circuit 40 via the pad T7. The current source IBA can be achieved, for example, by a current mirror circuit.

The operational amplifier OPA, the resistors RA1 and RA2, a resistor RA3, and a capacitor CA form an integration circuit. The integration circuit is a PI control circuit (Proportional-Integral Controller). The resistor RA3 and the capacitor CA are a feedback resistor and a feedback capacitor of the integration circuit, respectively, and are coupled in parallel to each other between pads T8 and T9. The voltage VA2 at the pad T7 and a voltage VA1 at the pad T8 are so controlled as to be equal to each other via an imaginary short circuit of the operational amplifier OPA. When the voltage VA2 in the forward direction of the diodes, which form the temperature sensor 3, changes, the operational amplifier OPA operates in such a way that the voltage VA2 is equal to the voltage VA1 at the pad T8 to produce the oven control signal VOV. The resistors RA1 and RA2 are each a variable resistor, and the variable resistance values thereof set the oven temperature.

The oven control signal VOV produced by the oven control circuit 40 is outputted via the pad T3, which is an output terminal, to the heater 2 provided in the oscillator 4. The heater 2 includes a heater transistor TB, which is a heat generator. The heater transistor TB is, for example, a heat generating MOS transistor. The oven control signal VOV controls the voltage at the gate of the heater transistor TB, whereby the heat generation performed by the heater 2 is controlled.

The temperature sensor 3 and the heater 2 for the oven control may be formed of a heater IC1, which is a single semiconductor chip, as shown in FIG. 6. The temperature sensor 3 and the oven control circuit 40 do not necessarily have the configurations shown in FIG. 6. For example, a thermistor may be used as the temperature sensor 3. The heater transistor for the heater 2 may be a heat generating bipolar transistor in place of a heat generating MOS transistor. The heater 2 may instead be achieved by a Peltier device or a heat generating resistor.

Figure 7:
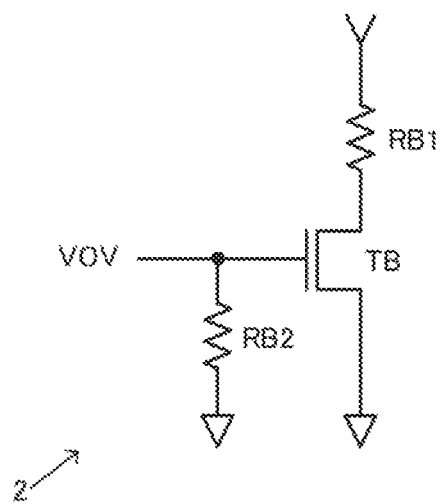
FIG. 7 shows an example of the configuration of a heater.

FIG. 7 shows an example of the configuration of the heater 2. The heater 2 includes the heater transistor TB and resistors RB1 and RB2. When the oven control signal VOV is inputted to the gate of the heater transistor TB, a current flows through the resistor RB1 and the heater transistor TB. The heater 2 thus generates heat. Further, providing the resistor RB2, which is a pull-down resistor, between the gate node of the heater transistor TB and GND allows the gate node to be pulled down to GND. As a result, in a period before the oven control circuit 40 activates the oven control, the heater transistor TB can be turned off so that no current flows therethrough.

Figure 8:
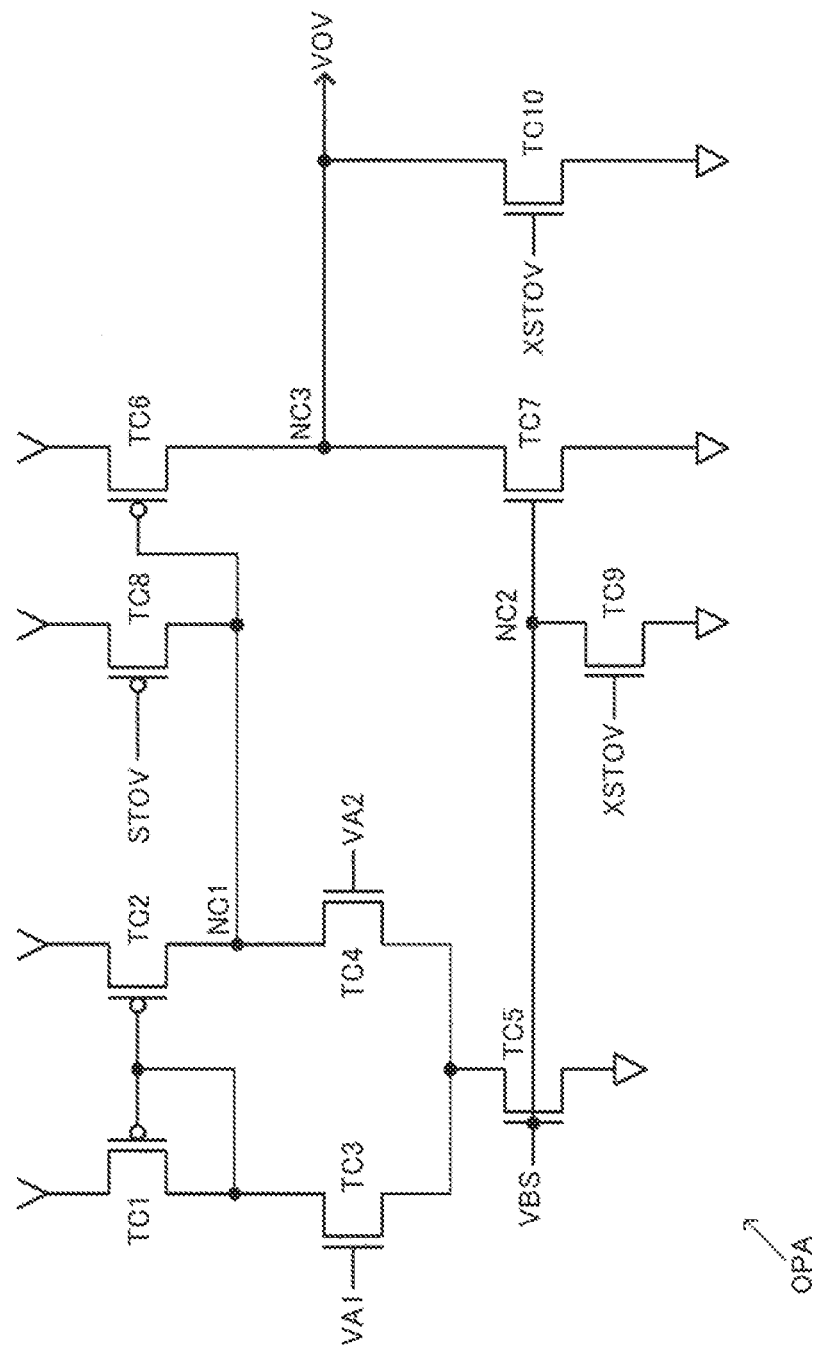
FIG. 8 shows an example of the configuration of an operational amplifier.

FIG. 8 shows an example of the configuration of the operational amplifier OPA. The operational amplifier OPA includes a differential section formed of transistors TC1, TC2, TC3, TC4, and TC5 and an output section formed of transistors TC6 and TC7. The transistors TC1 and TC2 form a current mirror circuit, and the voltages VA1 and VA2 are inputted to the gates of the transistors TC3 and TC4, which form a differential pair. A vias voltage VBS is inputted to the gates of the transistors TC5 and TC7, which serve as a vias current source. The oven control start signal STOV is inputted to the gate of a transistor TC8, and a negative-logic oven control start signal XSTOV is inputted to the gates of transistors TC9 and TC10. Therefore, when the level of the start signal STOV becomes the level L before the start of the oven control, an output node NC1 of the differential section of the operational amplifier OPA is pulled up, and when the level of the start signal XSTOV becomes the level H, a bias node NC2 of the bias voltage VBS and an output node NC3 of the operational amplifier OPA are pulled down. The action of the operational amplifier OPA is thus disabled, and the action of the oven control circuit 40 is also disabled. The oven control then starts, and when the levels of the start signals STOV and XSTOV become the level H and the level L, respectively, the transistors TC8, TC9, and TC10 are turned off, so that the pulled-up and pulled-down states described above are canceled. The operational amplifier OPA is therefore so set as to operate in the normal action state, whereby the oven control circuit 40 performs appropriate oven control.

3. Oscillator

Figure 9:
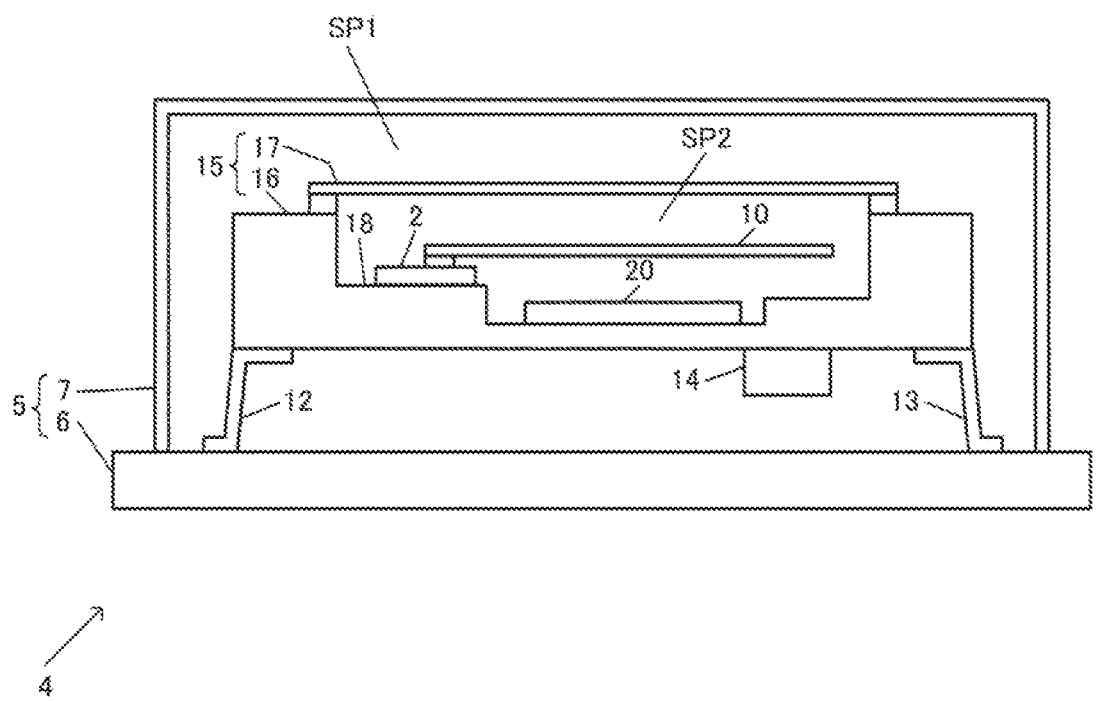
FIG. 9 shows an example of the structure of an oscillator.

FIG. 9 shows an example of the structure of the oscillator 4 according to the present embodiment. The oscillator 4 includes the resonator 10, the circuit apparatus 20, and a package 5, which accommodates the resonator 10 and the circuit apparatus 20. The package 5 is made, for example, of a ceramic material and has a hermetically sealed accommodation space SP1 therein. Specifically, the package 5 is formed of a substrate 6 and an enclosure 7, which is so provided as to form the accommodation space SP1 between the substrate 6 and the enclosure 7. External connection terminals for coupling the oscillator 4 to an external device are formed on the outer bottom surface of the substrate 6. The external connection terminals are, for example, VDD, GND, and CLK terminals.

A container 15, which forms the thermostat chamber, is provided in the accommodation space SP1 of the package 5. The container 15 is formed of a base 16 and a lid 17, which is so provided as to form an accommodation space SP2 between the base 16 and the lid 17. The resonator 10, the circuit apparatus 20, and the heater 2 are provided in the accommodation space SP2 formed by the base 16 and the lid 17. The base 16 of the container 15 is supported by supports 12 and 13, which are provided on the inner bottom surface of the substrate 6 of the package 5.

A stepped section 18 is provided in the base 16 of the container 15, and the heater 2 is disposed in the stepped section 18. Specifically, the heater IC1 shown in FIG. 6 is disposed as the heater 2. The temperature sensor 3 can thus be disposed in the thermostat chamber, which is the accommodation space SP2 of the container 15. A temperature sensor separate from the heater 2 may be disposed in the thermostat chamber.

The resonator 10 is supported by the stepped section 18 via the heater 2. The circuit apparatus 20 is disposed below the resonator 10. The term "below" corresponds to the direction from the enclosure 7 of the package 5 toward the substrate 6 thereof. Specifically, the circuit apparatus 20, which is a semiconductor chip, is disposed in a recess in the inner bottom surface of the base 16. A circuit part 14 is provided on the outer bottom surface of the base 16. The circuit part 14 is, for example, a capacitor, a resistor, or a temperature sensor. The resonator 10 and the circuit apparatus 20 are electrically coupled to each other by using internal wiring lines, terminal electrodes, or electrically conductive bumps.

4. Electric Instrument and Vehicle

Figure 10:
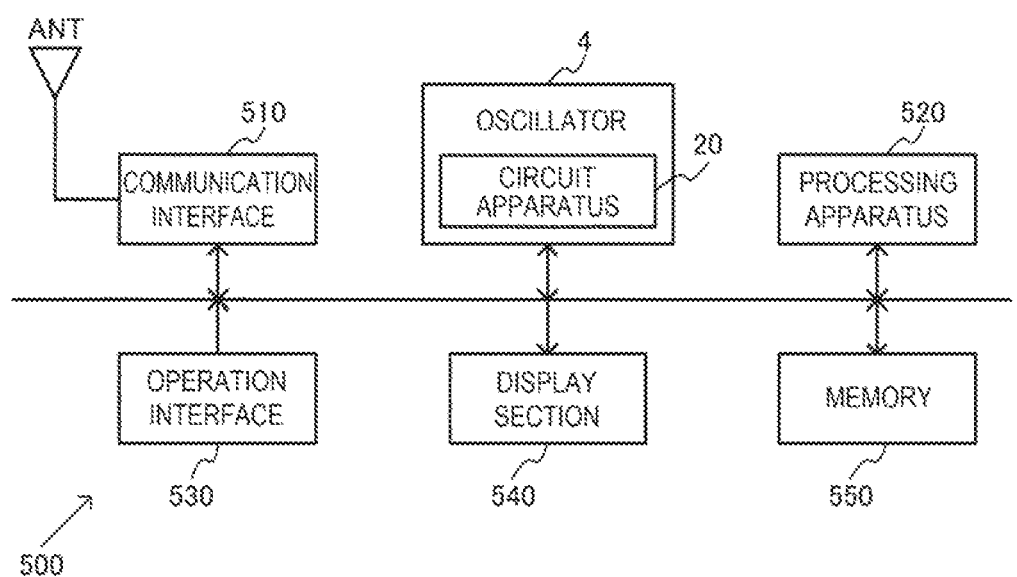
FIG. 10 shows an example of the configuration of an electric instrument.

FIG. 10 shows an example of the configuration of an electric instrument 500 including the circuit apparatus according to the present embodiment. The electric instrument 500 includes the circuit apparatus 20 according to the present embodiment and a processing apparatus 520, which operates in accordance with the clock signal CLK based on the oscillation signal OSCK from the oscillation circuit 30 of the circuit apparatus 20. Specifically, the electric instrument 500 includes the oscillator 4 including the circuit apparatus 20 according to the present embodiment, and the processing apparatus 520 operates based on the clock signal CLK from the oscillator 4. The electric instrument 500 can further include an antenna ANT, a communication interface 510, an operation interface 530, a display section 540, and a memory 550. The electric instrument 500 does not necessarily have the configuration shown in FIG. 10, and a variety of variations are conceivable, that is, part of the components in the configuration can be omitted, or another component can be added to the configuration.

The electric instrument 500 is, for example, a network-related instrument, such as a base station and a router, a high-precision measurement instrument that measures a physical quantity, such as a distance, a time period, a flow speed, and a flow rate, a biological information measurement instrument that measures biological information, or an in-vehicle instrument. The biological information measurement instrument is, for example, an ultrasonic measurement apparatus, a pulse wave meter, and a blood pressure measurement apparatus. The in-vehicle instrument is, for example, an instrument for automatic driving. The electric instrument 500 may instead be a wearable instrument, such as a head mounted display and a timepiece-related instrument, a robot, a printing apparatus, a projection apparatus, a portable information terminal, such as a smartphone, a content providing instrument that distributes a content, and a video instrument, such as a digital camera and a video camcorder.

The electric instrument 500 may still instead be an instrument used in a next-generation mobile communication system, such as a 5G mobile communication system. For example, the circuit apparatus 20 according to the present embodiment can be used in a variety of instruments, such as a base station of a next-generation mobile communication system, a remote radio head (RRH), or a mobile communication terminal. A next-generation mobile communication system requires a high-precision clock frequency, for example, for time synchronization and is suitable for an application of the circuit apparatus 20 according to the present embodiment capable of producing the high-precision clock signal CLK.

The communication interface 510 receives data from an external component and transmits data to the external component via the antenna ANT. The processing apparatus 520, which is a processor, controls the electric instrument 500 and performs a variety of digital processing on the data transmitted and received via the communication interface 510. The functions of the processing apparatus 520 can be achieved, for example, by a microcomputer or any other processor. The operation interface 530 allows a user to perform input operation and can be achieved, for example, by operation buttons or a touch panel display. The display section 540 displays a variety of types of information and can be achieved, for example, by a display based on a liquid crystal or organic EL material. The memory 550 stores data, and the functions of the memory 550 can be achieved, for example, by a semiconductor memory, such as a RAM and a ROM.

Figure 11:
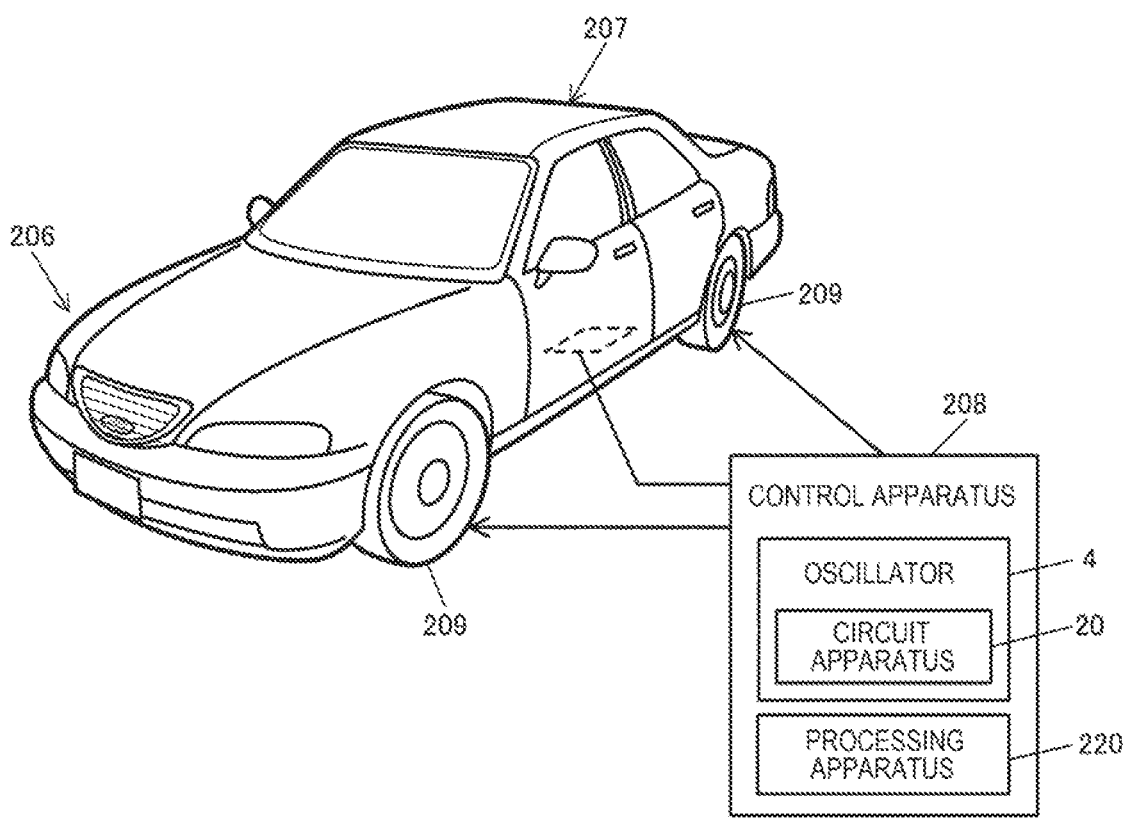
FIG. 11 shows an example of the configuration of a vehicle.

FIG. 11 shows an example of a vehicle including the circuit apparatus 20 according to the present embodiment. The vehicle includes the circuit apparatus 20 according to the present embodiment and a processing apparatus 220, which operates in accordance with the clock signal CLK based on the oscillation signal OSCK from the oscillation circuit 30 of the circuit apparatus 20. Specifically, the vehicle includes the oscillator 4 including the circuit apparatus 20 according to the present embodiment, and the processing apparatus 220 operates based on the clock signal CLK from the oscillator 4. The circuit apparatus 20 according to the present embodiment can be incorporated into a variety of vehicles, for example, a car, an airplane, a motorcycle, a bicycle, or a ship. The vehicle is, for example, any of instruments and apparatuses that include an engine, a motor, or any other drive mechanism, a steering wheel, a rudder, or any other steering mechanism, and a variety of electronic instruments and travel on the ground, in the sky, or on the sea. FIG. 11 schematically shows an automobile 206 as a specific example of the vehicle. The automobile 206 incorporates the circuit apparatus 20 according to the present embodiment. Specifically, the automobile 206, which is a vehicle, includes a control apparatus 208, and the control apparatus 208 includes the oscillator 4 including the circuit apparatus 20 according to the present embodiment, and the processing apparatus 220, which operates based on the clock signal CLK produced by the oscillator 4. The control apparatus 208, for example, controls the degree of hardness of the suspension in accordance with the posture of a vehicle body 207 and performs braking control on individual wheels 209. For example, the control apparatus 208 may achieve automatic driving of the automobile 206. An instrument that incorporates the circuit apparatus 20 according to the present embodiment is not necessarily the control apparatus 208, and the circuit apparatus 20 can be incorporated in a variety of in-vehicle instruments, such as a meter panel instrument and a navigation instrument provided in a vehicle, such as the automobile 206.

As described above, the circuit apparatus according to the present embodiment includes an oscillation circuit that causes a resonator to oscillate to produce an oscillation signal, an oven control circuit that controls a heater provided in correspondence with the resonator, a non-volatile memory that stores control data, a holding circuit that holds the control data transferred from the non-volatile memory, and a processing circuit that carries out a process based on the control data held in the holding circuit. After a power source voltage is supplied, the processing circuit carries out the process of transferring the control data from the non-volatile memory to the holding circuit, and after the transfer of the control data is completed, the processing circuit causes based on a data transfer end signal the oven control circuit to start operating.

According to the present embodiment, the oscillation circuit causes the resonator to oscillate to produce the oscillation signal, and the oven control circuit controls the heater provided in correspondence with the resonator. The non-volatile memory stores the control data, the holding circuit holds the control data transferred from the non-volatile memory, and the processing circuit carries out a process based on the held control data. According to the present embodiment, after the power source voltage is supplied, the control data is transferred from the non-volatile memory to the holding circuit, and after the transfer of the control data is completed, the oven control circuit starts operating. As described above, in the present embodiment, the oven control circuit does not start operating immediately after the power source voltage is supplied, but the control data is transferred from the non-volatile memory to the holding circuit before the oven control circuit starts operating. After the transfer of the control data is completed, the oven control circuit starts controlling the heater. In this way, the oven control circuit does not start operating in the data transfer period in which the control data is transferred from the non-volatile memory to the holding circuit, so that no oven control in which the heater is controlled is performed. The situation in which an unstable power source voltage in the data transfer period causes incorrect control data to be transferred to the holding circuit and other troubles can therefore be suppressed.

In the present embodiment, the processing circuit may include a digital signal processing circuit that performs digital signal processing including temperature compensation performed on the oscillation frequency of the resonator. The control data may include action control data for controlling the action of the oscillation circuit and digital signal processing data used in the digital signal processing. The holding circuit may include a register that holds the action control data and a RAM that holds the digital signal processing data.

The oscillation circuit can thus be so controlled as to start the oscillation action by using the action control data, which is control data on the action of the oscillation circuit and which is transferred from the non-volatile memory to the register. After the oscillation circuit thus starts the oscillation action using the resonator and produces the oscillation signal, the digital signal processing data transferred from the non-volatile memory to the register can be used to allow the digital signal processing circuit to perform the digital signal processing.

In the present embodiment, the digital signal processing data may contain at least one of temperature compensation coefficient data used in the temperature compensation and digital filter coefficient data used in digital filtering.

Storing at least one of the temperature compensation coefficient data and the digital filter coefficient data in the RAM as the digital signal processing data and as the control data transferred from the non-volatile memory as described above allows data storage using a smaller circuit area than data storage in the register, whereby the scale of the circuit apparatus can be reduced.

In the present embodiment, an initial value may be set in the register after the power source voltage is supplied, and in the period after the power source voltage is supplied but before the control data is transferred from the non-volatile memory to the holding circuit, the oscillation action of the oscillation circuit may be enabled based on the action control data set as the initial value in the register.

In this way, after the power source voltage is supplied, the oscillation action of the oscillation circuit is enabled based on the action control data set as the initial value in the register, and the oscillation action is allowed to start.

In the present embodiment, the circuit apparatus may include an amplitude detection circuit that detects the amplitude of the oscillation signal. After the action of the oscillation circuit is enabled, and when the amplitude detection circuit detects that the amplitude of the oscillation signal has exceeded a predetermined value, the processing circuit may start transferring the control data from the non-volatile memory to the holding circuit.

In this way, the transfer of the control data is allowed to start provided that the amplitude of the oscillation signal becomes a proper level after the action of the oscillation circuit is enabled, whereby appropriate data transfer can be achieved.

In the present embodiment, the circuit apparatus may include an amplitude detection circuit that detects the amplitude of the oscillation signal. After the power source voltage is supplied, the oscillation circuit starts the oscillation action, and when the amplitude detection circuit detects that the amplitude of the oscillation signal exceeds a predetermined value, the processing circuit may start transferring the control data from the non-volatile memory to the holding circuit.

In this way, the transfer of the control data is allowed to start provided that the amplitude of the oscillation signal becomes a proper level after the power source voltage is supplied and the oscillation circuit starts the oscillation action, whereby appropriate data transfer can be achieved.

In the present embodiment, the processing circuit may include a transfer control circuit that controls the transfer from the non-volatile memory and an activation control circuit that controls the activation of the oven control circuit. After the power source voltage is supplied, the transfer control circuit may instruct the transfer of the control data from the non-volatile memory to the holding circuit, and after the transfer of the control data is completed, the transfer control circuit may output a data transfer end signal to the activation control circuit to cause the oven control circuit to start operating.

In this way, after the power source voltage is supplied, the transfer control circuit is used to instruct the transfer of the control data, and when the transfer is completed, the transfer control circuit outputs the data transfer end signal to the activation control circuit, whereby the activation control circuit can be used to cause the oven control circuit to start operating.

In the present embodiment, the activation control circuit may cause the oven control circuit to start operating when an oven control enable signal set by the control data in the holding circuit is active and the data transfer end signal is active.

In this way, also when the oven control enable signal is set to be active, the oven control circuit does not start operating immediately after the power source voltage is supplied, and the oven control circuit waits for the completion of the transfer of the control data from the non-volatile memory to the holding circuit and is then allowed to start operating.

The present embodiment further relates to an oscillator including the circuit apparatus described above, the resonator, and a heater.

The present embodiment further relates to an electronic instrument including the circuit apparatus described above and a processing apparatus that operates in accordance with a clock signal based on the oscillation signal.

The present embodiment further relates to a vehicle including the circuit apparatus described above and a processing apparatus that operates in accordance with a clock signal based on the oscillation signal.

The present embodiment has been described above in detail, and a person skilled in the art will readily appreciate that a large number of variations are conceivable to the extent that they do not substantially depart from the novel items and effects of the present disclosure. Such variations are all therefore assumed to fall within the scope of the present disclosure. For example, a term described at least once in the specification or the drawings along with a different term having a boarder meaning or the same meaning can be replaced with the different term anywhere in the specification or the drawings. Further, any combination of the present embodiment and the variations fall within the scope of the present disclosure. Moreover, the configuration, action, and other factors of each of the circuit apparatus, the oscillator, the electronic instrument, and the vehicle are not limited to those described in the present embodiment, and a variety of changes can be made thereto.

What is claimed is:

1. A circuit apparatus comprising:
an oscillation circuit that causes a resonator to oscillate to produce an oscillation signal;
an oven control circuit that controls a heater provided in correspondence with the resonator;
a non-volatile memory that stores control data;
a holding circuit that holds the control data transferred from the non-volatile memory; and
a processing circuit that carries out a process based on the control data held in the holding circuit,
wherein after a power source voltage is supplied, the processing circuit carries out the process of transferring the control data from the non-volatile memory to the holding circuit, and after the transfer of the control data is completed, the processing circuit causes, based on a data transfer end signal, the oven control circuit to start operating,
wherein the processing circuit includes a transfer control circuit that controls the transfer from the non-volatile memory and an activation control circuit that controls the activation of the oven control circuit, and
after the power source voltage is supplied, the transfer control circuit instructs the transfer of the control data from the non-volatile memory to the holding circuit, and after the transfer of the control data is completed, the transfer control circuit outputs a data transfer end signal to the activation control circuit to cause the oven control circuit to start operating.

2. The circuit apparatus according to claim 1,
wherein the processing circuit includes a digital signal processing circuit that performs digital signal processing including temperature compensation performed on an oscillation frequency of the resonator,
the control data includes action control data for controlling the action of the oscillation circuit and digital signal processing data used in the digital signal processing, and
the holding circuit includes a register that holds the action control data and a RAM that holds the digital signal processing data.

3. The circuit apparatus according to claim 2,
wherein the digital signal processing data contains at least one of temperature compensation coefficient data used in the temperature compensation and digital filter coefficient data used in digital filtering.

4. The circuit apparatus according to claim 2,
wherein an initial value is set in the register after the power source voltage is supplied, and
in a period after the power source voltage is supplied but before the control data is transferred from the non-volatile memory to the holding circuit, an oscillation action of the oscillation circuit is enabled based on the action control data set as the initial value in the register.

5. The circuit apparatus according to claim 4,
further comprising an amplitude detection circuit that detects an amplitude of the oscillation signal,
wherein after the action of the oscillation circuit is enabled, and when the amplitude detection circuit detects that the amplitude of the oscillation signal exceeds a predetermined value, the processing circuit starts transferring the control data from the non-volatile memory to the holding circuit.

6. The circuit apparatus according to claim 1,
further comprising an amplitude detection circuit that detects an amplitude of the oscillation signal,
wherein after the power source voltage is supplied, the oscillation circuit starts an oscillation action, and
when the amplitude detection circuit detects that the amplitude of the oscillation signal exceeds a predetermined value, the processing circuit starts transferring the control data from the non-volatile memory to the holding circuit.

7. The circuit apparatus according to claim 1,
wherein the activation control circuit causes the oven control circuit to start operating when an oven control enable signal set by the control data in the holding circuit is active and the data transfer end signal is active.

8. An oscillator comprising:
the circuit apparatus according to claim 1;
the resonator; and
a heater.

9. An electronic instrument comprising:
the circuit apparatus according to claim 1; and
a processing apparatus that operates in accordance with a clock signal based on the oscillation signal.

10. A vehicle comprising:
the circuit apparatus according to claim 1; and
a processing apparatus that operates in accordance with a clock signal based on the oscillation signal.

11. A circuit apparatus comprising:
an oscillation circuit that causes a resonator to oscillate to produce an oscillation signal;
an oven control circuit that controls a heater provided in correspondence with the resonator;
a non-volatile memory that stores control data;
a holding circuit that holds the control data transferred from the non-volatile memory; and
a processing circuit that carries out a process based on the control data held in the holding circuit,
wherein after a power source voltage is supplied, the processing circuit carries out the process of transferring the control data from the non-volatile memory to the holding circuit, and after the transfer of the control data is completed, the processing circuit causes, based on a data transfer end signal, the oven control circuit to start operating,
wherein the processing circuit includes a digital signal processing circuit that performs digital signal processing including temperature compensation performed on an oscillation frequency of the resonator,
the control data includes action control data for controlling the action of the oscillation circuit and digital signal processing data used in the digital signal processing, and
the holding circuit includes a register that holds the action control data and a RAM that holds the digital signal processing data.

12. A circuit apparatus comprising:
an oscillation circuit that causes a resonator to oscillate to produce an oscillation signal;
an oven control circuit that controls a heater provided in correspondence with the resonator;
a non-volatile memory that stores control data;
a holding circuit that holds the control data transferred from the non-volatile memory;
a processing circuit that carries out a process based on the control data held in the holding circuit, wherein after a power source voltage is supplied, the processing circuit carries out the process of transferring the control data from the non-volatile memory to the holding circuit, and after the transfer of the control data is completed, the processing circuit causes, based on a data transfer end signal, the oven control circuit to start operating; and an amplitude detection circuit that detects an amplitude of the oscillation signal, wherein after the power source voltage is supplied, the oscillation circuit starts an oscillation action, and when the amplitude detection circuit detects that the amplitude of the oscillation signal exceeds a predetermined value, the processing circuit starts transferring the control data from the non-volatile memory to the holding circuit.

\* \* \* \* \*